(12) United States Patent
Armanini

(10) Patent No.: US 7,874,260 B2
(45) Date of Patent: Jan. 25, 2011

(54) APPARATUS AND METHOD FOR SUBSTRATE ELECTROLESS PLATING

(75) Inventor: Edward Armanini, Tracy, CA (US)

(73) Assignee: Lam Research Corporation, Fremont, CA (US)

( * ) Notice: Subject to any disclaimer, the term of this patent is extended or adjusted under 35 U.S.C. 154(b) by 1127 days.

(21) Appl. No.: 11/552,794

(22) Filed: Oct. 25, 2006

(65) Prior Publication Data
US 2008/0102210 A1 May 1, 2008

(51) Int. Cl.
*B05C 3/05* (2006.01)
(52) U.S. Cl. .................. 118/423; 118/428; 118/429; 118/500
(58) Field of Classification Search ............. 118/500, 118/52, 319, 320, 423, 428, 429, 57; 134/186, 134/184, 105, 108; 156/345.1, 345.11; 427/437, 427/438
See application file for complete search history.

(56) References Cited

U.S. PATENT DOCUMENTS 5,368,645 A * 11/1994 Bok ......................... 118/500
5,571,367 A * 11/1996 Nakajima et al. ......... 156/345.15
5,921,560 A * 7/1999 Moshtagh ..................... 279/3
6,558,518 B1 * 5/2003 Sendai et al. ............. 204/224 R
2004/0097071 A1 5/2004 Ivanov et al.

* cited by examiner

*Primary Examiner*—Laura Edwards
(74) *Attorney, Agent, or Firm*—Martine Penilla & Gencarella, LLP

(57) ABSTRACT

A body structure has an inner region shape that defines a cavity within the body structure. The cavity within the body structure is designed to hold a fluid. A chuck includes a top that is capable of holding a substrate, and a body portion that has a complementary shape with respect to the inner region shape of the body structure. The complementary shape of the chuck body portion at least partially aligns with the inner region shape that defines the body structure cavity. The chuck body portion is designed to move into the cavity of the body structure and displace the fluid held within the cavity, so as to shift the fluid over the top of the chuck. The body portion of the chuck is also designed to move out of the cavity of the body structure, so as to remove the fluid from over the top of the chuck.

7 Claims, 8 Drawing Sheets

APPARATUS AND METHOD FOR SUBSTRATE ELECTROLESS PLATING

BACKGROUND OF THE INVENTION

In the fabrication of semiconductor devices such as integrated circuits, memory cells, and the like, a series of manufacturing operations are performed to define features on semiconductor wafers ("wafers"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

To build an integrated circuit, transistors are first created on the surface of the wafer. The wiring and insulating structures are then added as multiple thin-film layers through a series of manufacturing process steps. Typically, a first layer of dielectric (insulating) material is deposited on top of the formed transistors. Subsequent layers of metal (e.g., copper, aluminum, etc.) are formed on top of this base layer, etched to create the conductive lines that carry the electricity, and then filled with dielectric material to create the necessary insulators between the lines.

Although copper lines are typically comprised of a PVD seed layer (PVD Cu) followed by an electroplated layer (ECP Cu), electroless chemistries are under consideration for use as a PVD Cu replacement, and even as a ECP Cu replacement. Thus, an electroless plating process can be used to build the copper conduction lines. During the electroless plating process, electrons are transferred from a reducing agent to the copper ions in the solution resulting in the deposition of reduced copper onto the wafer surface. The formulation of the electroless copper plating solution is optimized to maximize the electron transfer process involving the copper ions in solution. The plating thickness achieved through the electroless plating process is dependent on the residency time of the electroless plating solution on the wafer. Because the electroless plating reactions occur immediately and continuously upon exposure of the wafer to the electroless plating solution, it is desirable to control the application of the electroless plating solution to the wafer.

SUMMARY OF THE INVENTION

In one embodiment, a system is disclosed for performing electroless plating of a substrate. The system includes a body structure and a chuck. The body structure has an inner region shape that defines a cavity within the body structure. The cavity within the body structure is designed to hold a fluid. The chuck includes a top that is capable of holding the substrate. The chuck also includes a body portion that has a complementary shape with respect to the inner region shape that defines the cavity within the body structure. The complementary shape of the body portion of the chuck at least partially aligns with the inner region shape of the cavity within the body structure. The body portion of the chuck is designed to move into the cavity of the body structure and displace the fluid held within the cavity, so as to shift the fluid over the top of the chuck. The body portion of the chuck is further designed to move out of the cavity, so as to remove the fluid from over the top of the chuck.

In another embodiment, an apparatus is disclosed for electroless plating of a substrate. The apparatus includes a vessel that has an interior cavity defined by a cavity surface contour. The apparatus also includes a chuck designed to fit within the vessel interior cavity, such that a gap exists between a periphery of the chuck and the vessel interior cavity surface. The chuck includes a body portion having an exterior surface contour that substantially matches the cavity surface contour of the vessel. The chuck is also designed to hold a substrate, such that a top surface of the substrate is maintained in a substantially level orientation. The apparatus further includes a shaft connected to the chuck. The shaft is designed to effect movement of the chuck in a vertical direction within the vessel interior cavity. A lowering of the chuck, to bring the exterior surface of the chuck body portion within close proximity to the vessel interior cavity surface, causes an electroless plating solution present between the chuck and vessel to be displaced upward and flow in a substantially uniform manner through the gap between the periphery of the chuck and the vessel interior cavity surface.

In another embodiment, a method is disclosed for electroless plating of a substrate. The method includes an operation for securing a substrate to be plated on a chuck. The chuck maintains a top surface of the substrate in a substantially level orientation. The method also includes an operation for positioning the chuck within a cavity of a vessel, such that a body portion of the chuck is maintained in a spaced apart relationship with a surface of the cavity. The method further includes an operation for disposing an electroless plating solution between the body portion of the chuck and the surface of the cavity, such that an upper surface of the electroless plating solution is at a level lower than the substrate secured on the chuck. Additionally, the method includes an operation for lowering the chuck within the cavity to cause the electroless plating solution to be displaced upward and flow over the top surface of the substrate in a substantially uniform manner, from a periphery of the substrate to a center of the substrate.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
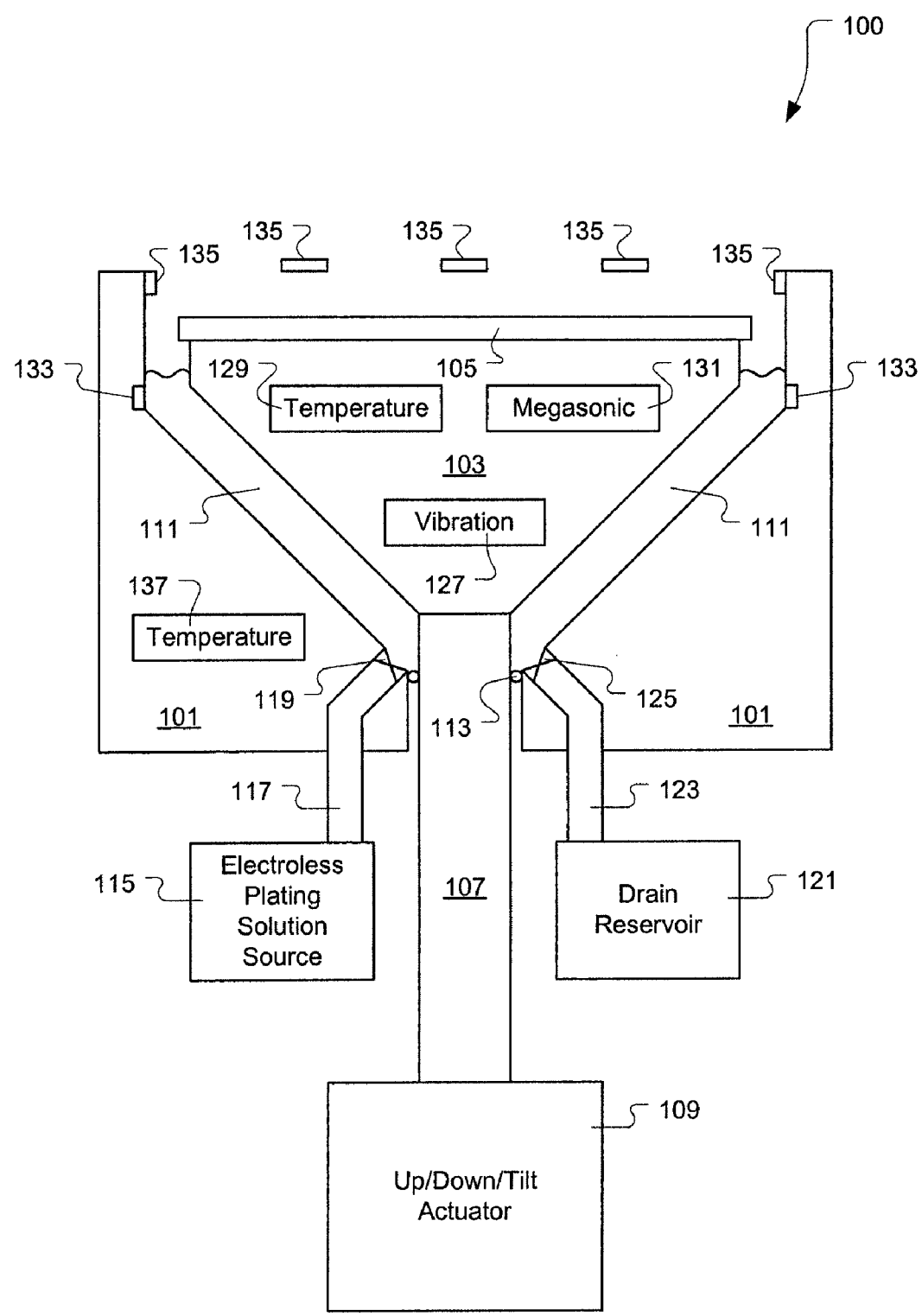
FIG. 1 is an illustration showing a cross-sectional view of an apparatus for electroless plating of a substrate, in accordance with one embodiment of the present invention.

FIG. 1 is an illustration showing a cross-sectional view of an apparatus 100 for electroless plating of a substrate 105, in accordance with one embodiment of the present invention. In one embodiment, the apparatus 100 of FIG. 1 is radially symmetric about a centerline of the apparatus 100. It should be understood that the system 100 can be used to electrolessly plate essentially any type of substrate 105. In one embodiment, the substrate 105 is a semiconductor wafer. The apparatus 100 includes a chuck 103 having a top that is capable of holding the substrate 105. In one embodiment, the chuck 103 uses a vacuum force to hold the substrate 105 thereon. However, it should be appreciated that the chuck 103 can incorporate a means other than vacuum to hold the substrate 105 thereon. Also, in one embodiment, the chuck 103 is designed to hold the substrate 105 such that a top surface of the substrate 105 is maintained in a substantially level orientation during the electroless plating operation. The chuck 103 is constructed of material compatible with the electroless plating process and associated chemistry. For example, in one embodiment, the chuck 103 is constructed of teflon coated aluminum.

The apparatus 100 also includes a vessel 101, i.e., body structure 101, having an inner region shape that defines a cavity within the vessel 101. The cavity within the vessel 101 is defined to hold a fluid, e.g., an electroless plating solution. Thus, the interior cavity of the vessel 101 is defined by a cavity surface contour. As with the chuck 103, the vessel 101 is constructed of material compatible with the electroless plating process and associated chemistry, e.g., teflon coated aluminum.

The chuck 103 includes a body portion having a complementary shape with respect to the interior cavity surface contour of the vessel 101. Also, the complementary shape of the chuck 103 body portion at least partially aligns with the interior cavity surface contour of the vessel 101. Thus, the chuck 103 includes a body portion having an exterior surface contour that substantially matches the interior cavity surface contour of the vessel 101. Additionally, the chuck 103 is designed to fit within the vessel 101 interior cavity such that a gap exists between a periphery of the chuck 103 and the vessel 101 interior cavity surface.

In one embodiment, the chuck 103 is designed so that an edge of the substrate 105 overhangs the periphery of the top surface of the chuck 103. This embodiment enables easier edge handling of the substrate 105. In this embodiment, the gap between the periphery of the chuck 103 and the vessel 101 interior cavity surface is defined to have sufficient size so as to maintain a flow path for fluid between the periphery of the substrate 105 and the vessel 101 interior cavity surface. In other embodiments, the chuck 103 can be designed to extend radially beyond a periphery of the substrate 105. It should be appreciated that regardless of the particular chuck 103 embodiment, the chuck 103 and vessel 101 are defined to maintain a sufficient gap between the periphery of the chuck 103 and the vessel 101 interior cavity surface.

The apparatus 100 also includes a shaft 107 connected to the chuck 103 and designed to effect movement of the chuck 103 in a vertical direction within the vessel 101 interior cavity. The shaft 107 extends through an access at a lower region of the vessel 101 interior cavity. In one embodiment, a seal 113 is provided between the shaft and the vessel 101 to prevent fluid leakage from the vessel 101 interior cavity. An actuator 109 is provided to control the vertical movement of the shaft 107 and chuck 103. In various embodiments, the actuator 109 can utilize a lead screw, air cylinders, hydraulics, etc., to provide the vertical movement of the shaft 107 and chuck 103. Also, in one embodiment, the actuator 109 includes a mechanism to control a tilt of the chuck 103 top surface with respect to level.

Prior to the electroless plating process, the chuck 103 is raised to a level suitable for loading of the substrate 105 on the top surface of the chuck 103. Also, prior to the electroless plating process, the chuck 103 is maintained in a spaced apart relationship with respect to the vessel 101. Specifically, the chuck 103 is maintained at a height that causes a region to exist between the exterior surface of the body portion of the chuck 103 and the cavity surface of the vessel 101. Prior to the electroless plating process, this region between the chuck 103 and vessel 101 contains electroless plating solution 111, such that an upper surface of the electroless plating solution 111 is maintained at a level lower than the substrate 105, i.e., lower than the top of the chuck 103.

The apparatus 100 further includes a supply line 117 for supplying the electroless plating solution 111 from a source 115 to the region between the exterior surface of the body portion of the chuck 103 and the cavity surface of the vessel 101. A valve 119 is provided to control, e.g., start and stop, the flow of electroless plating solution 111 from the supply line 117 to the region between the chuck 103 and the cavity surface of the vessel 101.

Figure 2:
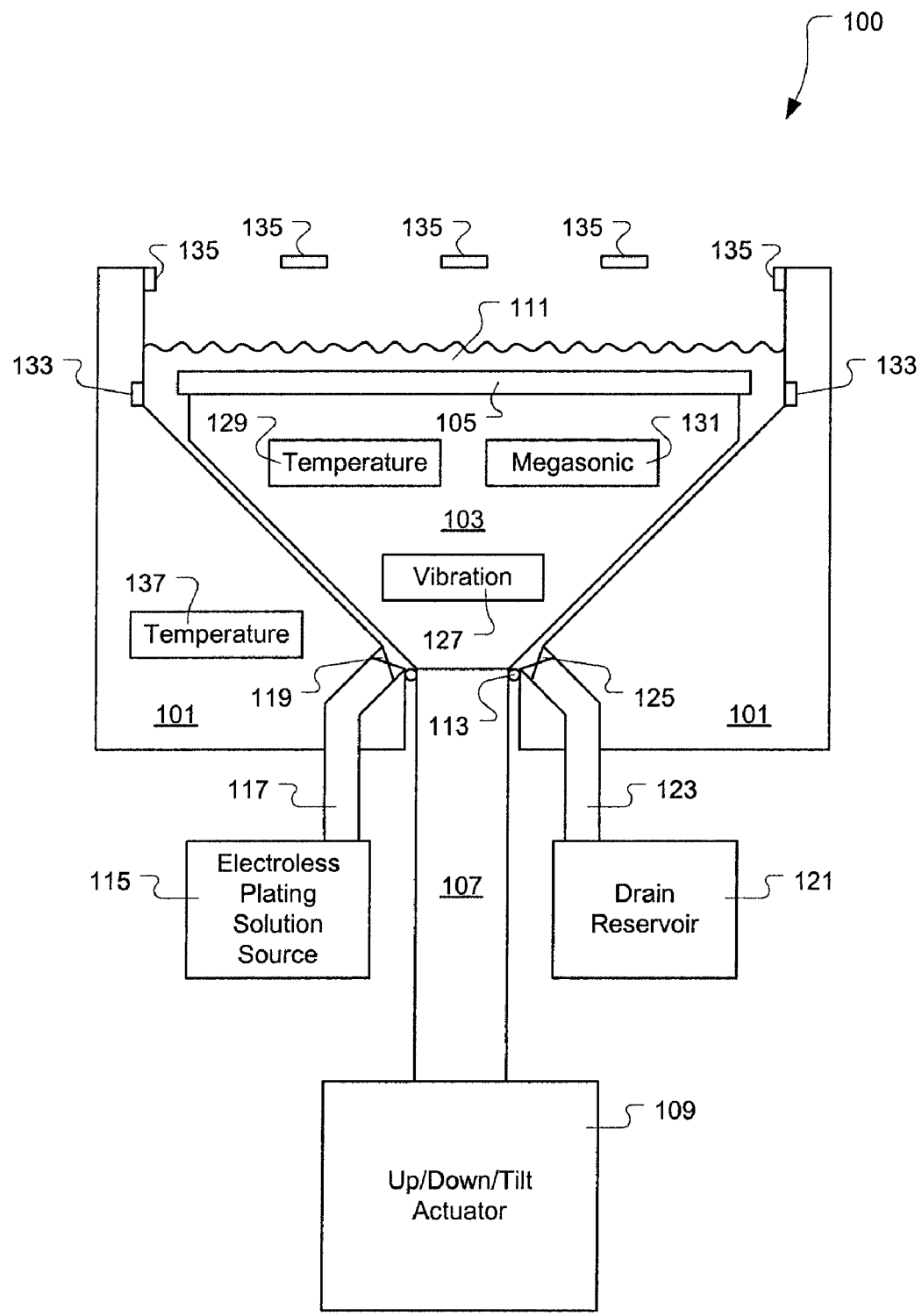
FIG. 2 is an illustration showing the apparatus of FIG. 1 with the chuck in a lowered position such that the electroless plating solution flows over the top surface of the substrate, in accordance with one embodiment of the present invention.

To initiate the electroless plating process, the chuck 103 is lowered within the cavity of the vessel 101 so as to bring the exterior surface of the chuck 103 body portion within close proximity to the cavity surface of the vessel 101. As the chuck 103 is lowered, the electroless plating solution 111 is displaced upward by the body portion of the chuck 103. Specifically, the electroless plating solution 111 is displaced to flow in a substantially uniform manner through the gap between the periphery of the chuck 103 and the vessel 101 interior cavity surface. When the electroless plating solution 111 reaches the top surface of the substrate 105, the electroless plating solution 111 flows over the top surface of the substrate 105. FIG. 2 is an illustration showing the apparatus 100 of FIG. 1 with the chuck 103 in a lowered position such that the electroless plating solution 111 flows over the top surface of the substrate 105, in accordance with one embodiment of the present invention.

The chuck 103 and vessel 101 are designed to enable an even flow of the electroless plating solution 111 over the top surface of the substrate 105. Specifically, the flow gap between the periphery of the chuck 103 and the vessel 101 interior cavity surface is optimized to ensure an optimal upward flow of electroless plating solution 111 around the periphery of the chuck 103 as the chuck 103 is lowered. It should be appreciated that the vessel 101 interior cavity is defined to have sufficient height so as to prevent overflow of displaced electroless plating solution 111 as the chuck 103 is lowered.

Figure 3:
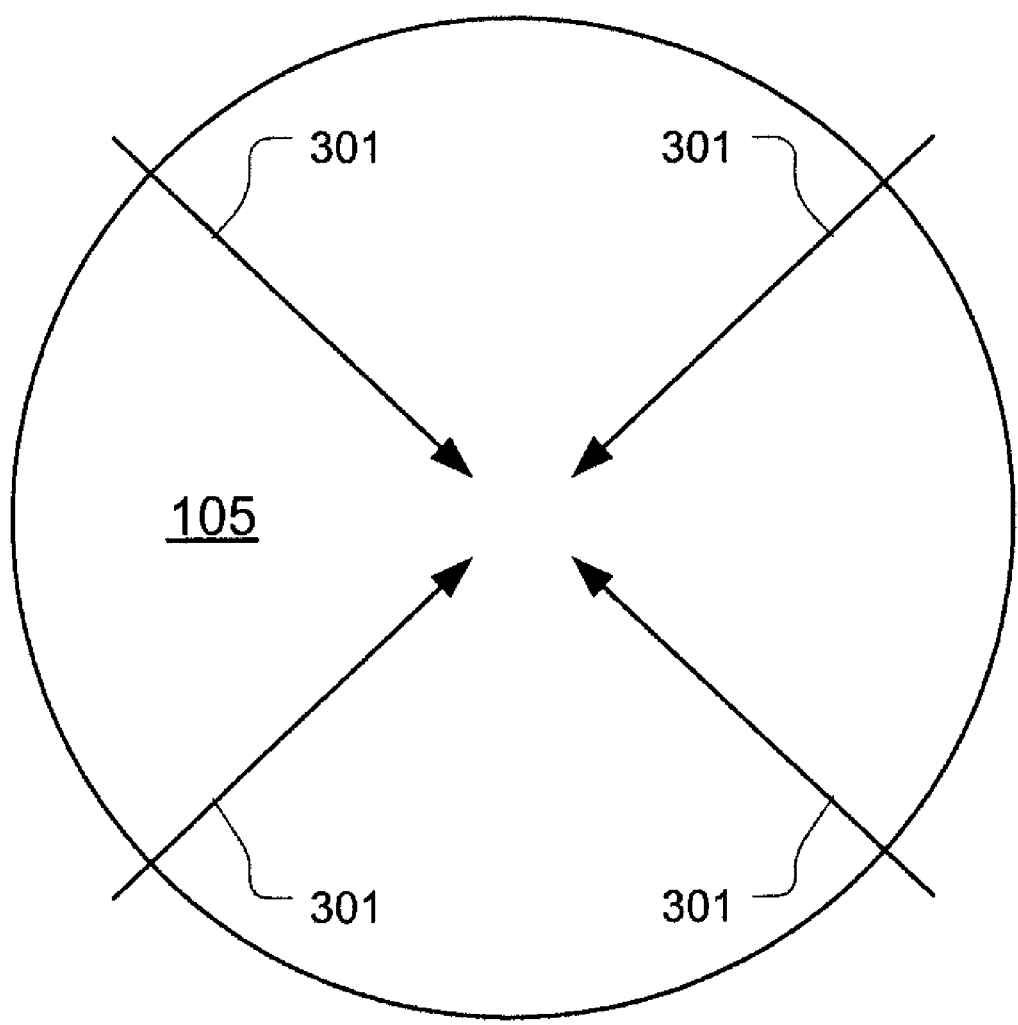
FIG. 3 is an illustration depicting the flow of the electroless plating solution over the top surface of the substrate, in accordance with one embodiment of the present invention.

In one embodiment, the top surface of the chuck 103 is maintained in a substantially level orientation as the chuck 103 is lowered, such that the substrate 105 held on the chuck 103 is also maintained in a substantially level orientation as the chuck 103 is lowered. With the chuck 103 and substrate 105 maintained in a substantially level orientation, the electroless plating solution 111 will reach a peripheral edge of the top surface of the substrate 105 in a substantially uniform manner. Thus, as the chuck 103 is lowered, the electroless plating solution 111 will be displaced upward and will be made to flow across the top surface of the substrate 105 in a substantially uniform manner from the periphery of the substrate 105 to the center of the substrate 105. FIG. 3 is an illustration depicting the flow of the electroless plating solution 111 over the top surface of the substrate 105, in accordance with one embodiment of the present invention. Arrows 301 indicate the direction of electroless plating solution 111 flow from the periphery of the substrate 105 to the center of the substrate 105.

Also, in one embodiment, the exterior surface of the body portion of the chuck 103 and the cavity surface of the vessel 101 are defined to minimize a volume of electroless plating solution 111 required to perform the electroless plating process. Specifically, the region between the chuck 103 and vessel 101 prior to lowering the chuck 103 is defined to contain a volume of electroless plating solution 111 that is just sufficient to enable covering of the top surface of the substrate 105 by electroless plating solution 111 when the chuck 103 is in a fully lowered position.

The plating thickness on the substrate 105 is a function of the electroless plating solution 111 residence time on the substrate 105. Therefore, the chuck 103 is maintained at the lowered position for an amount of time as prescribed to complete the electroless plating operation. Then, the chuck 103 is raised within the cavity of the vessel 101 so as to reform the region between the exterior surface of the body portion of the chuck 103 and the cavity surface of the vessel 101. Thus, as the chuck 103 is raised, the electroless plating solution 111 present over the substrate 105 will flow off of the substrate 105, through the gap between the periphery of the chuck 103 and the vessel 101, and back into the region between the chuck 103 and the vessel 101.

The apparatus 100 further includes a drain line 123 for draining fluid from the region between the exterior surface of the body portion of the chuck 103 and the cavity surface of the vessel 101, to a drain reservoir 121. A valve 125 is provided to control, e.g., start and stop, the draining of fluid from the region between the chuck 103 and the cavity surface of the vessel 101. In one embodiment, when the chuck 103 is raised, the valve 125 is opened to enable draining of the electroless plating solution 111.

Figure 4:
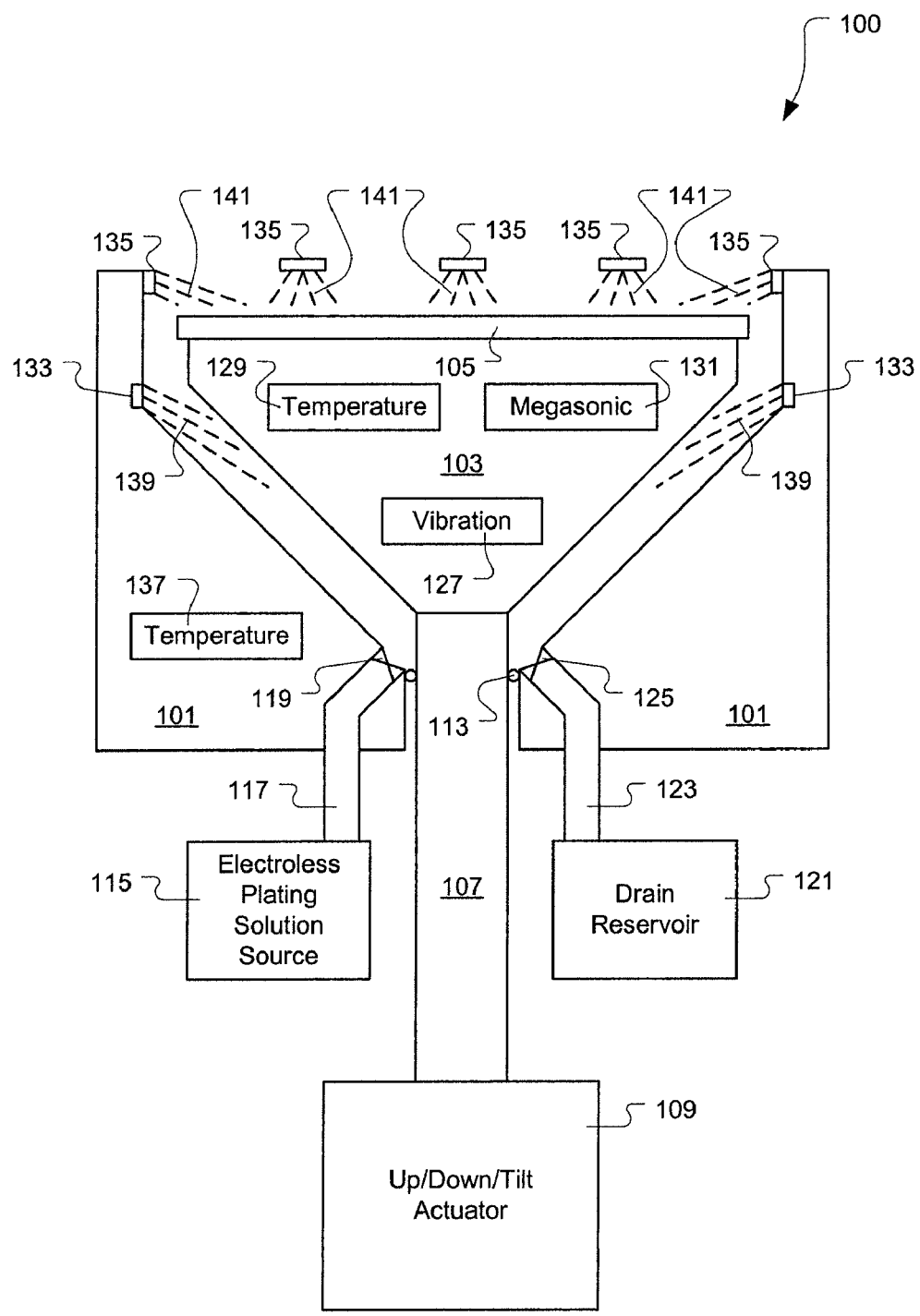
FIG. 4 is an illustration showing the apparatus after raising the chuck following the electroless plating operation, in accordance with one embodiment of the present invention.

FIG. 4 is an illustration showing the apparatus 100 after raising the chuck 103 following the electroless plating operation, in accordance with one embodiment of the present invention. Removal of the electroless plating solution 111 from the top surface of the substrate 105 terminates the electroless plating operation. Therefore, it is beneficial to rapidly and uniformly remove the electroless plating solution 111 from the top surface of the substrate 105 upon raising the chuck 103.

Figure 5:
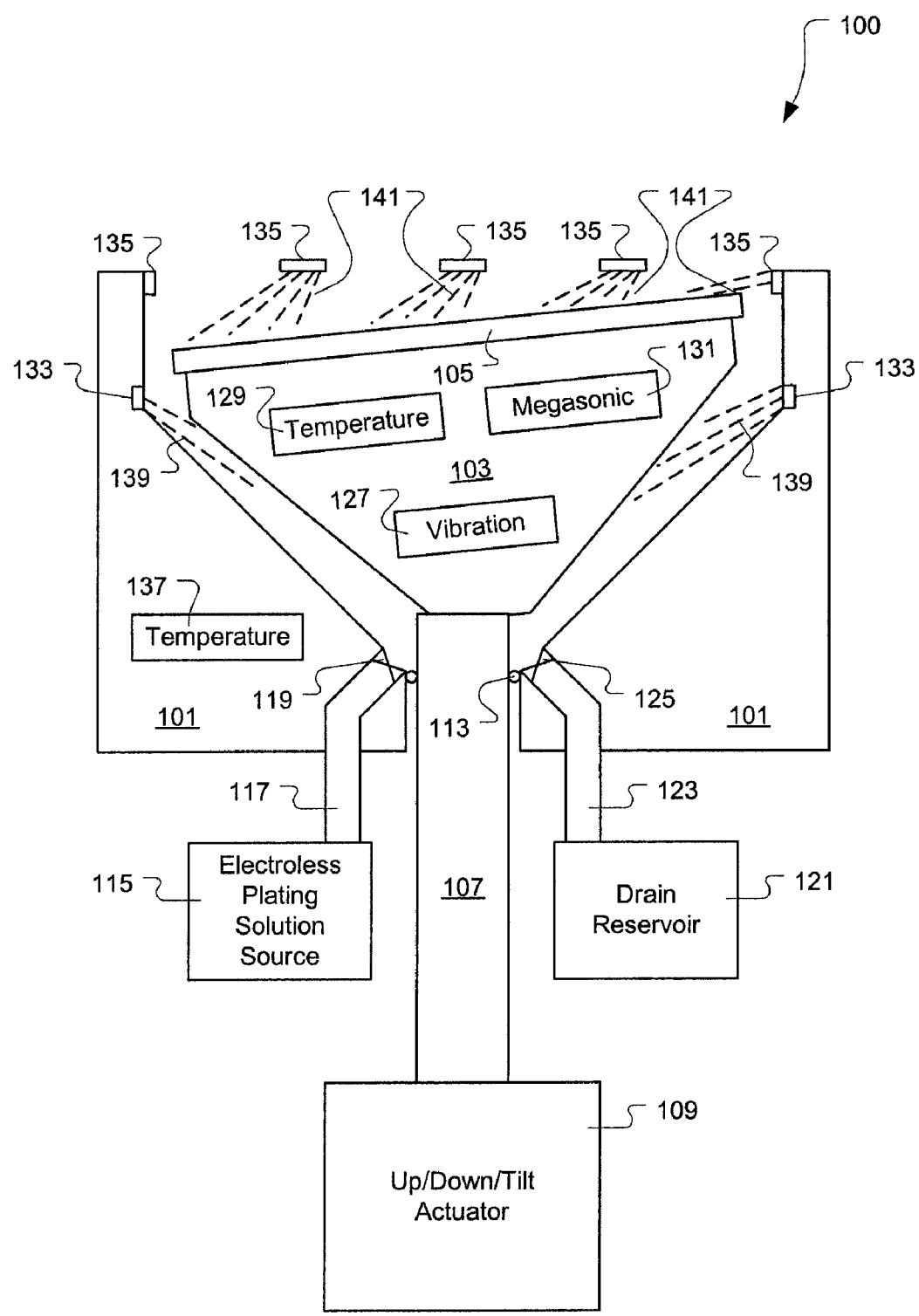
FIG. 5 is an illustration showing the apparatus of FIG. 4 with the chuck in a tilted position to facilitate rinsing of the substrate, in accordance with one embodiment of the present invention.

To enable removal of the electroless plating solution 111 from the substrate 105, a number of fluid dispensers 135 are positioned to direct a rinsing fluid 141 toward the top of the chuck 103, i.e., toward the top surface of the substrate 105. Also, in one embodiment, the chuck 103 can be tilted to place the top surface of the substrate 105 in an off-level orientation in conjunction with rinsing the top surface of the substrate 105. FIG. 5 is an illustration showing the apparatus 100 of FIG. 4 with the chuck 103 in a tilted position to facilitate rinsing of the substrate 105, in accordance with one embodiment of the present invention.

In addition to rinsing the top surface of the substrate 105, the apparatus 100 enables rinsing of the exterior surface of the body portion of the chuck 103 and the cavity surface of the vessel 101. For example, a number of fluid dispensers 133 are positioned to direct a rinsing fluid 139 toward the region between the chuck 103 and the cavity surface of the vessel 101. During the rinsing operation, the valve 125 is opened to enable draining of the rinsing fluid 141/139. In one embodiment, deionized water is used as the rinsing fluid 141/139. However, compatible rinsing fluids other than deionized water may also be used with the apparatus 100.

The plating thickness on the substrate 105 is also a function of the temperature of the electroless plating solution 111. With reference to FIG. 1, in one embodiment the chuck 103 is designed to include a temperature control 129 for controlling a temperature of the chuck 103 and, correspondingly, a temperature of the substrate 105. Also, the vessel 101 is designed to include a temperature control 137 for controlling a temperature of the vessel 101, specifically a temperature of the vessel 101 interior cavity surface that is in contact with the electroless plating solution 111. In one embodiment, the temperature controls 129 and 137 are capable of controlling the surface temperatures of the chuck 103 and vessel 101 in contact with the electroless plating solution 111 within 1 degree Celsius of a target temperature. It should be appreciated that the target temperature for the electroless plating process can vary depending on the specific electroless plating solution 111 chemistry and the materials on the substrate 105 to be plated. Additionally, in various embodiments, the temperature controls 129 and 137 can be implemented using resistance heaters, heat transfer fluid circulation, or other suitable means.

The apparatus 100 can also incorporate a vibration control 127 to transfer vibrational energy to the chuck 103 during the electroless plating process. For example, in one embodiment, the vibrational energy transferred to the chuck 103 can be used to assist in replenishment of reactants at the surface of the substrate 105 being plated. In another embodiment, the vibrational energy transferred to the chuck 103 can be used to assist in removal of the electroless plating solution 111 from the substrate 105 during the rinsing process. The apparatus 100 can also incorporate a megasonic energy control 131 to transfer megasonic energy to the chuck 103 during the electroless plating process. As with the vibrational energy, the megasonic energy can be used to assist in replenishment of reactants at the surface of the substrate 105 during the plating process and/or removal of the electroless plating solution 111 from the substrate 105 during the rinsing process.

Figure 6:
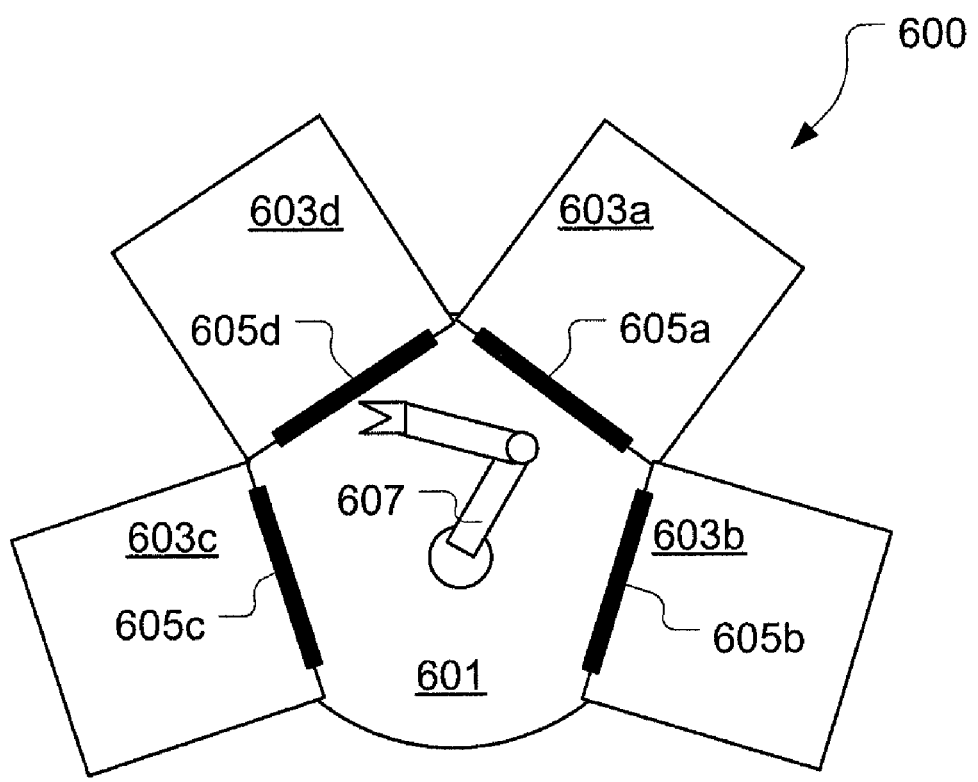
FIG. 6 is an illustration showing a top view of a central cluster tool platform including multiple process modules, in accordance with one embodiment of the present invention.

FIG. 6 is an illustration showing a top view of a central cluster tool platform ("tool platform") 600 including multiple process modules 603a-603d, in accordance with one embodiment of the present invention. The tool platform 600 includes a central area 601 from which an access 605a-605d of each process module 603a-603d is accessible. A substrate, e.g., wafer, transfer mechanism 607 is disposed within the central area 601, such that a substrate can be transferred to or from each process module 603a-603d. In one embodiment, the transfer mechanism 607 is defined as a robotic manipulation device. Though the exemplary tool platform 600 of FIG. 6 shows four process modules 603a-603d, it should be appreciated that other embodiments of the tool platform 600 can include more or less process modules. Furthermore, it should be appreciated that each process module 603a-603d can be defined to perform one or more substrate processing operations, as known to those skilled in the art.

The apparatus 100 as described herein can be implemented as a process module 603a-603d. In one embodiment, the tool platform 600 can be implemented as an ambient controlled processing cluster. In this embodiment, the central area 601 can be defined as a managed transport module (MTM) with ambient control capability. For example, if the substrate needs to be transferred through the central area 601 in an oxygen free atmosphere, the MTM can be controlled to provide an oxygen free atmosphere, e.g., a nitrogen atmosphere. This is particularly useful when the apparatus 100 is implemented as a process module 603a-603d, as the electroless plating process is likely to be performed in an oxygen free atmosphere to prevent oxidation of exposed materials present on the substrate.

Figure 7:
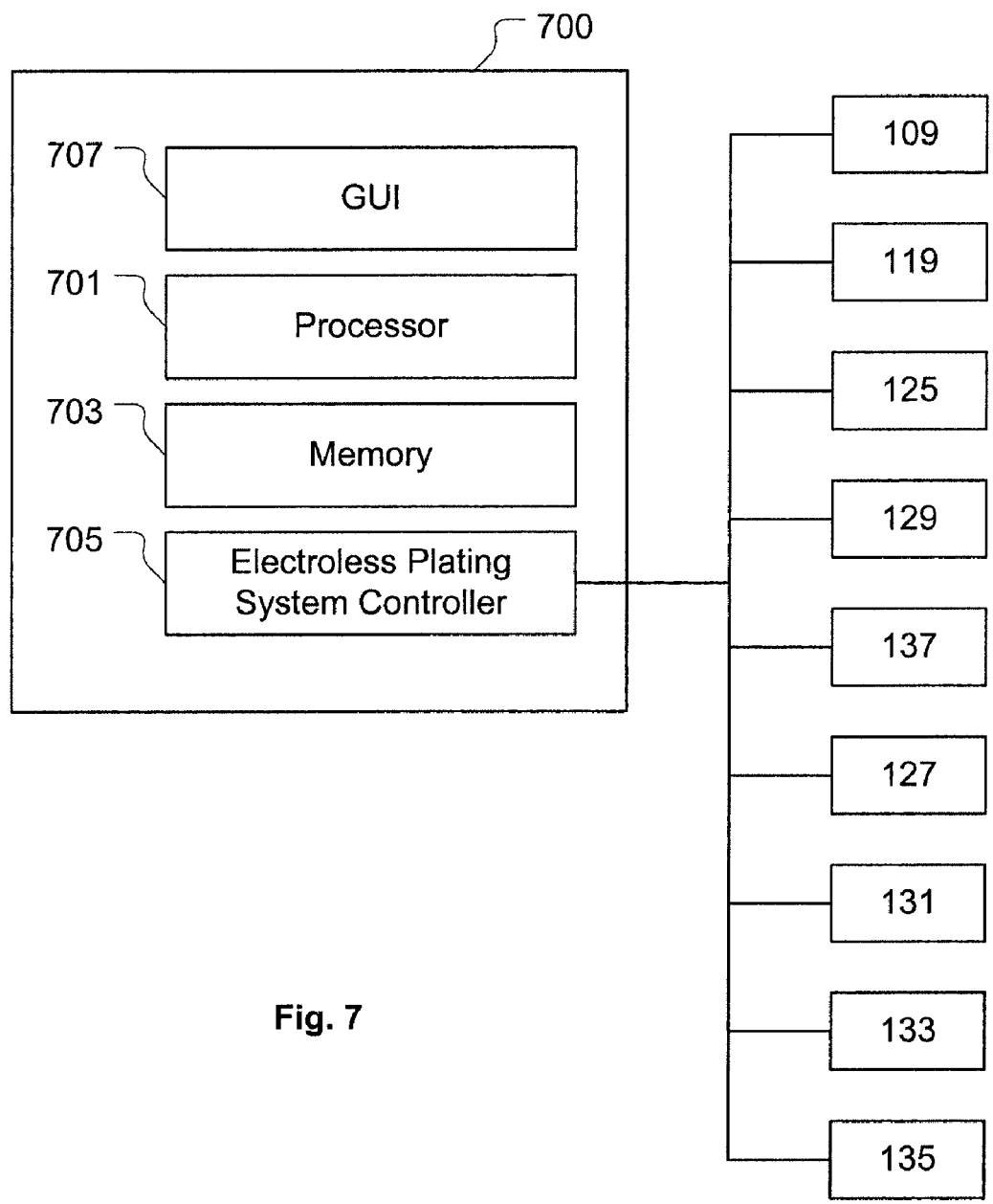
FIG. 7 is an illustration showing a control system for directing an electroless plating process using the apparatus of FIG. 1, in accordance with one embodiment of the present invention.

In addition to the foregoing, it should be appreciated that essentially all operations of the apparatus 100 can be controlled through a computer system. FIG. 7 is an illustration showing a control system for directing an electroless plating process using the apparatus 100 of FIG. 1, in accordance with one embodiment of the present invention. An exemplary computer system 700 is shown as including a processor 701, a memory 703, and an electroless plating system controller 705. The computer system 700 can be implemented using essentially any type of compatible processor 701 and memory 703.

The system controller 705 is defined to enable control of the vertical movement and tilt actuator 109, the valves 119 and 125, the temperature controls 129 and 137, the vibration control 127, the megasonic control 131, and the fluid dispense nozzles 135 and 133. The system controller 705 is also defined to receive sensory or feedback signals from the various components within the apparatus 100. By way of the processor 701 and memory 703, the system controller 705 can be defined to communicate with a graphical user interface (GUI) 707. The GUI 707 can be defined to provide status data with regard to various components of the apparatus 100. The GUI 707 can also be defined to receive user input for controlling the various components of the apparatus 100. In one embodiment, the GUI 707 can be used to program an entire electroless plating process to be performed using the apparatus 100, as orchestrated by the system controller 705.

Figure 8:
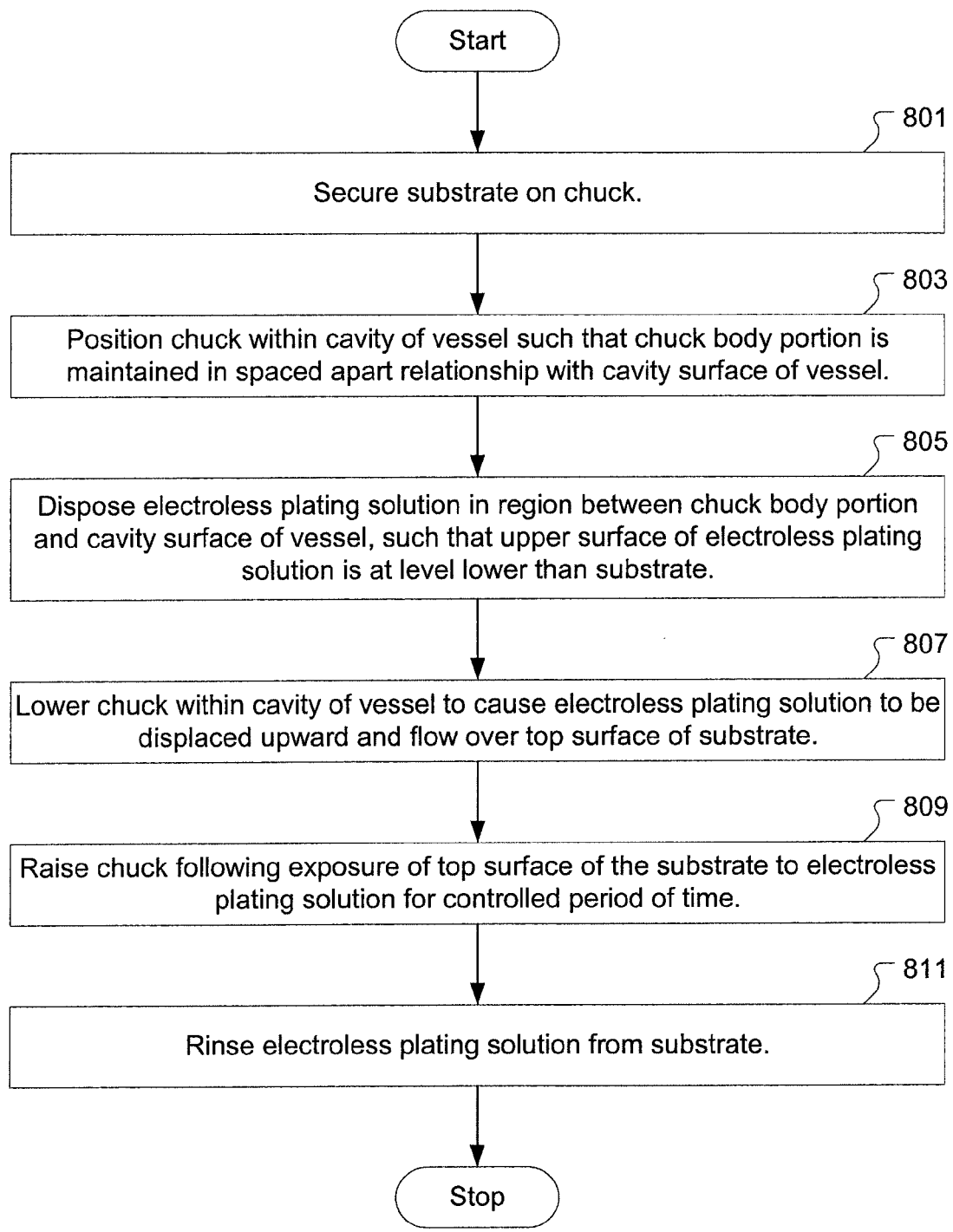
FIG. 8 is a flowchart of a method for electroless plating of a substrate, in accordance with one embodiment of the present invention.

FIG. 8 is a flowchart of a method for electroless plating of a substrate, in accordance with one embodiment of the present invention. The method includes an operation 801 for securing a substrate to be plated on a chuck, such as the chuck 103 described with regard to the apparatus 100. The chuck maintains a top surface of the substrate in a substantially level orientation. In an operation 803, the chuck is positioned within a cavity of a vessel, e.g., vessel 101 of apparatus 100, such that a body portion of the chuck is maintained in a spaced apart relationship with a surface of the cavity of the vessel 101. The method also includes an operation 805 for disposing an electroless plating solution in a region between the body portion of the chuck and the surface of the cavity, such that an upper surface of the electroless plating solution is at a level lower than the substrate.

In an operation 807, the chuck is lowered within the cavity of the vessel to cause the electroless plating solution to be displaced upward and flow over the top surface of the substrate. The electroless plating solution flows over the top surface of the substrate in a substantially uniform manner from a periphery of the substrate to a center of the substrate. The method further includes an operation 809 for raising the chuck following exposure of the top surface of the substrate to the electroless plating solution for a controlled period of time.

Raising of the chuck causes the electroless plating solution to flow off of the top surface of the substrate into the region between the body portion of the chuck and the cavity of the vessel. In an operation 811, the top surface of the substrate is rinsed in conjunction with raising the chuck. In one embodiment, the operation 811 can include tilting the chuck to place the top surface of the substrate in an off-level orientation in conjunction with rinsing the top surface of the substrate. Additionally, in one embodiment, the operation 811 can include rinsing the region between the body portion of the chuck and the surface of the vessel cavity in conjunction with rinsing the top surface of the substrate.

In various embodiments, the method of FIG. 8 can further include additional operations for influencing the electroless plating process. For example, an operation can be performed to control a temperature of the chuck and the vessel. In one embodiment, the temperature of the chuck and vessel is controlled within about 1 degree Celsius of a target temperature. In another embodiment, an operation can be performed to transfer vibrational energy to the chuck in the interest of assisting with replenishment of reactants at the surface of the substrate being plated, or in the interest of assisting with removal of the electroless plating solution from the substrate during the rinsing process. In another embodiment, an operation can be performed to transfer megasonic energy to the chuck in the interest of assisting with replenishment of reactants at the surface of the substrate being plated, or in the interest of assisting with removal of the electroless plating solution from the substrate during the rinsing process.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. An apparatus for electroless plating of a substrate, comprising:
    a vessel having an interior cavity defined by a cavity surface contour;
    a chuck having a top surface defined to hold a substrate such that a top surface of the substrate to be plated is maintained in a substantially level orientation facing upward, the chuck designed to fit within the vessel interior cavity such that a gap exists between a periphery of the chuck and the vessel interior cavity surface, the chuck including a body portion formed below the top surface of the chuck, the body portion having an exterior surface contour that substantially matches the cavity surface contour; and
    a shaft connected to a bottom region of the chuck and designed to effect movement of the chuck in a vertical direction within the vessel interior cavity such that a lowering of the chuck to bring the exterior surface of the chuck body portion within close proximity to the vessel interior cavity surface causes an electroless plating solution present between the chuck and vessel to be displaced upward and flow in a substantially uniform manner through the gap between the periphery of the chuck and vessel interior cavity surface and over the top surface of the chuck.

2. An apparatus for electroless plating of a substrate as recited in claim 1, further comprising:

one or more fluid dispensers positioned to direct a rinsing fluid toward the chuck such that the top surface of the substrate when present will be impacted by the rinsing fluid.

3. An apparatus for electroless plating of a substrate as recited in claim 1, further comprising:
   a valve actuated supply line disposed to supply electroless plating solution to a region between the chuck and the cavity surface of the vessel.

4. An apparatus for electroless plating of a substrate as recited in claim 1, further comprising:
   a valve actuated drain line disposed to drain fluid from a region between the chuck and the cavity surface of the vessel.

5. An apparatus for electroless plating of a substrate as recited in claim 1, further comprising:
   one or more fluid dispensers positioned to directly supply a rinsing fluid to a region between the chuck and the cavity surface of the vessel.

6. An apparatus for electroless plating of a substrate as recited in claim 1, wherein the chuck is designed so that an edge of the substrate when present will overhang the periphery of the chuck, the gap between the periphery of the chuck and the vessel interior cavity surface having sufficient size to maintain a flow path for the electroless plating solution when the substrate is present.

7. An apparatus for electroless plating of a substrate as recited in claim 1, further comprising:
   a temperature control designed to control a temperature of the chuck and the vessel within a tolerance of about 1 degree Celsius.

* * * * *